United States Patent

Matsumoto

Patent Number: 5,177,379
Date of Patent: Jan. 5, 1993

[54] EMITTER COUPLED LOGIC CIRCUIT WITH REDUCED POWER CONSUMPTION AND HIGH SPEED

[75] Inventor: Kouji Matsumoto, Tokyo, Japan

[73] Assignee: NEC Corporation, Tokyo, Japan

[21] Appl. No.: 723,578

[22] Filed: Jul. 1, 1991

[30] Foreign Application Priority Data

Jun. 29, 1990 [JP]  Japan .................. 2-171472

[51] Int. Cl.⁵ .................. H03K 19/086; H03K 19/20
[52] U.S. Cl. .................. 307/455; 307/296.3; 307/270
[58] Field of Search .................. 307/270, 455, 296.3

[56] References Cited

U.S. PATENT DOCUMENTS

| | | | |
|---|---|---|---|
| 4,490,630 | 12/1984 | Freeman | 307/455 |
| 4,906,869 | 3/1990 | Masuoka | 307/455 |
| 5,012,128 | 4/1991 | Chan | 307/270 |
| 5,041,743 | 8/1991 | Matsumoto | 307/455 |
| 5,089,724 | 2/1992 | Chuang et al. | 307/455 |

*Primary Examiner*—Edward P. Westin
*Assistant Examiner*—Richard Roseen
*Attorney, Agent, or Firm*—Laff, Whitesel, Conte & Saret

[57] ABSTRACT

An emitter coupled logic circuit includes a differential amplifier circuit provided between a higher potential source and a first lower potential source; an emitter follower first transistor whose base is connected to a first output node of the differential amplifier, whose collector is connected to the higher potential source, and whose emitter is connected to an output node; a second transistor whose collector is connected to the higher potential source, whose emitter is connecrted to a second lower potential having its potential higher than that of the first lower potential and whose base is connected to its collector through a resistor; and a pull-down third transistor whose collector is connected to the output terminal and whose emitter is connected to the collector of the second transistor through a resistor. The circuit may further include a capacitor which is connected between the second output node of the differential amplifier and the base of said third transistor. The power consumption of the circuit is reduced and the operation speeds thereof are improved.

5 Claims, 3 Drawing Sheets

EMITTER COUPLED LOGIC CIRCUIT WITH REDUCED POWER CONSUMPTION AND HIGH SPEED

BACKGROUND OF THE INVENTION

The present invention relates to an emitter coupled logic (ECL) circuit and, more particularly, to an emitter follower circuit in which power consumption is reduced and which operates at a high speed.

An emitter follower circuit has low output impedance and has high driving capability so that such circuit is widely used as an output stage for an emitter coupled logic circuit (hereinafter referred to as "ECL" circuit). Conventionally, it has been general that an emitter follower circuit is formed between a ground potential source and a negative potential source VEE ($-4.5$ V or $-5.2$ V) with the use of an emitter follower transistor and a terminating load resistor. However, a trend in recent years is that, instead of the terminal resistor, a pull-down transistor is used and further a capacitor is used for an emitter follower circuit in which an operating speed at the falling of an output is improved. In such conventional ECL circuit, because the emitter follower is terminated to the power source through the pull-down transistor, one of the problems is that the power consumption is large. Configuration of such conventional ECL circuit and various problems existing therein are fully explained later before the present invention is described.

SUMMARY OF THE INVENTION

It is, therefore, an object of the present invention to overcome the problems existing in the conventional ECL circuit and to provide an improved ECL circuit in which its power consumption is reduced and its operation speeds are improved.

According to one aspect of the invention, there is provided an emitter coupled logic circuit which comprises:

a differential amplifier circuit provided between a higher potential source and a first lower potential source and having a first and a second output node;

a first transistor forming an emitter follower configuration and having its base connected to the first output node of the differential amplifier circuit, its collector connected to the higher potential source, and its emitter connected to an output terminal;

a second transistor having its collector connected to the higher potential source through a current source, its emitter connected to a second lower potential source whose potential is higher than that of the first lower potential source, and its base coupled to the collector thereof through a resistor; and a third transistor having its collector connected to the output terminal, its emitter connected to the second lower potential source, and its base coupled to a collector of the second transistor through a resistor.

According to another aspect of the invention, the above emitter coupled logic circuit may comprise a capacitor which is selectively connected between the second output node of the differential circuit and the base of the third transistor in accordance with the magnitude of the load capacitance connected to the output terminal.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, some embodiments of the present invention are explained with reference to the appended drawings.

Throughout the following explanation, similar reference symbols or numerals refer to the same or similar elements in all figures of the drawings.

For the purpose of assisting in the understanding of the present invention, a conventional ECL circuit will first be described with reference to FIG. 1 before the present invention is explained.

Figure 1:
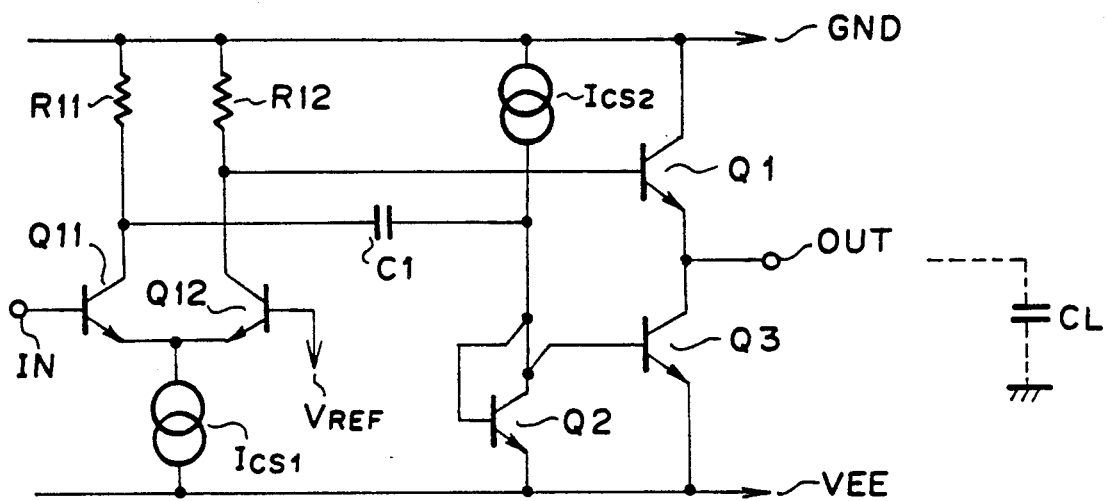
FIG. 1 is a circuit diagram showing a prior art ECL circuit.

FIG. 1 is a conventional ECL circuit of the kind explained above, which is proposed in the Japanese Patent Application Kokai No. Sho 63(1988)-302.620. In FIG. 1, Q11 and Q12 are transistors for effecting current switching operation, Q1 is a transistor forming an emitter follower configuration, Q2 and Q3 are transistors forming a current mirror circuit, $I_{CS1}$ and $I_{CS2}$ are constant current sources, R11 and R12 are load resistors, and C1 is a capacitor.

Next, the operation of the circuit shown in FIG. 1 is explained. When a signal having potential higher than that of a reference potential $V_{REF}$ is inputted to an input terminal IN, the transistor Q11 turns to its ON-state and the transistor Q12 turns to its OFF-state. In this instance, the constant current flows to the resistor R11 and not to the R12. Thus, a high level output signal $V_{OH}$ is outputted to an output terminal OUT as represented by the equation (1). (In the equations given hereunder, R11, R12, etc. represent respective resistance values, $I_{CS1}$, $I_{CS2}$, etc. represent respective current values, and VEE, VT, etc. represent respective voltages.)

$$V_{OH} = R12 \cdot I_B(Q1) - V_F(Q1) \qquad (1)$$

Here, $I_B(Q1)$ and $V_F(Q1)$ are respectively a base current of the transistor Q1 and a forward direction operation voltage thereof. Where the current amplification factor hfe of the transistor concerned is sufficiently large, the base current can be disregarded, so that the equation (1) may be simulated to the following equation (2).

$$V_{OH} = -V_F(Q1) \qquad (2)$$

On the contrary, where a signal having a potential lower than the reference potential $V_{REF}$ is inputted to the input terminal IN, the transistor Q11 turns to its OFF-state and the transistor Q12 turns to its ON-state and accordingly the constant current flows to the resistor R12. Consequently, the low level output signal $V_{OL}$ as represented by the following equation (3) is outputted to the output 1 terminal OUT.

$$V_{OL} = -R12 \cdot I_{CS2} - I_B(Q1) - V_f(Q1) \qquad (3)$$
$$\approx -R12 \cdot I_{CS2} - V_f(Q1)$$

During the steady-state period in which the output signal is high or low, the emitter follower circuit current $I_{EF}$ which flows in the transistors Q1 and Q3 equals to $I_{CS2}$ since the transistors Q2 and Q3 constitute a current mirror circuit. Thus, the power consumption of the ECL circuit may be represented by the following equation (4).

$$P = -(I_{CS1} - 2 \cdot I_{CS2}) \cdot VEE \qquad (4)$$

In transition of the output signal from low to high in this logic circuit, the current which charges a load capacitance CL flows to the emitter follower transistor Q1 in addition to the constant current $I_{CS2}$ which constantly or steadily flows to the transistor Q3. Also, in transition of the output signal from high to low, the transistor Q1 turns temporarily to its OFF-state thereby discharging the charge accumulated in the load capacitance CL through the pull-down transistor Q3. Here, the signal at the opposite phase side of the differential circuit changes from low to high, so that the capacitor C1 is charged. Since a part of the charging current becomes a base current of the transistor Q3 and is amplified thereat, the transistor Q3 can transitorily discharge the charges in the load capacitance CL with a large current.

In the conventional ECL circuit explained above, the emitter follower circuit is terminated to the power source VEE through the pull-down transistor Q3 resulting in a disadvantageously large power consumption. Also, since the capacitor C1 is connected directly to the collector of the transistor Q2, most of the current which discharges the capacitor C1 in transition of the output signal from high to low flows to the transistor Q2. Consequently, the charging current contributes little to the discharging of the load capacitance CL so that an improvement on an operation speed has not been sufficient.

In a gate-array type master-slice integrated circuit, the load capacitance to be driven varies widely on a case to case basis of internal logic circuits. This is because the lengths of wirings connected to output points widely vary in one logic circuit to another. In a conventional ECL type gate-array, however, all the internal ECL circuits are formed in the same configuration, so that the operation speed is considerably low in those logic circuits to which load capacitance is heavy. If the capacitor C1 is added for speed-up purposes, a problem here is that the operation speed in circuits to which load capacitance is light is unnecessarily speeded up and the resulting arrangement requires additional parts or elements.

Next, some embodiments of the invention are explained hereunder.

Figure 2:
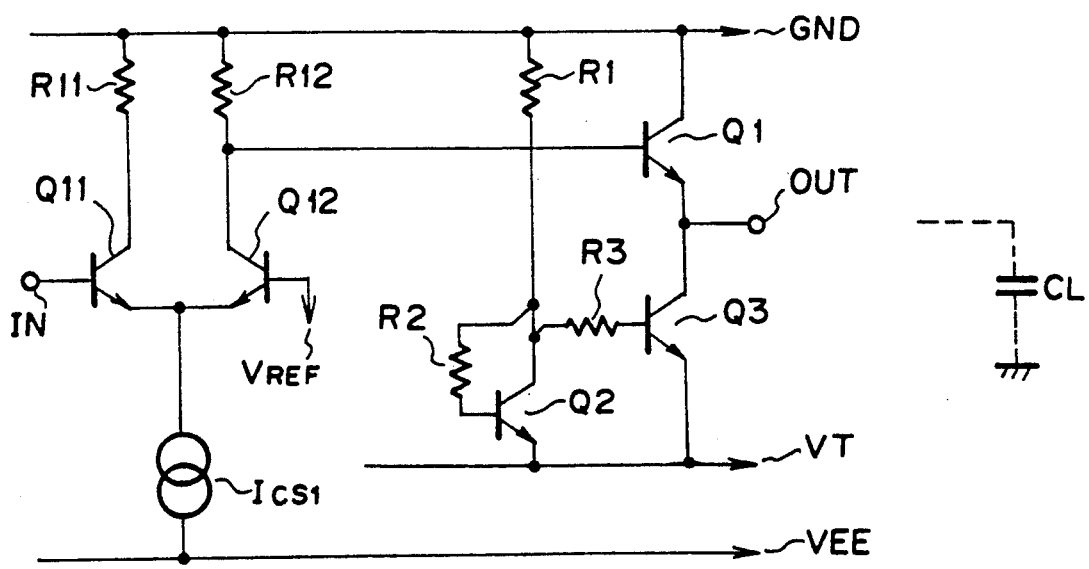
FIG. 2 is a circuit diagram of an ECL circuit of a first embodiment according to the invention.

FIG. 2 shows in a circuit diagram showing a first embodiment according to the present invention. In FIG. 2, Q11 and Q12 are current switching transistors respectively at the input terminal side and at the reference potential side. Collector load resistors R11 and R12 are connected between the respective collectors of the transistors Q11 and Q12 and the ground potential source GND. Between the commonly connected emitters of the transistors Q11, Q12 and a first negative potential source VEE, there is connected a constant current source $I_{CS1}$ thereby forming an emitter coupled differential circuit.

In the circuit according to this first embodiment, an emitter follower circuit which is formed by a first transistor Q1 constituting an emitter follower configuration and a third transistor Q3 for pull-down function is disposed between the ground potential source GND and a second negative potential source VT. The base of the transistor Q1 is connected to the collector of the transistor Q12 thereby allowing the emitter follower circuit to output to an output terminal OUT a signal which is in phase with the input signal.

The transistor Q3 together with a transistor Q2 forms a current mirror circuit and the current to be inputted to the current mirror circuit is supplied from the ground potential source GND through a first resistor R1. To the respective bases of the transistors Q2 and Q3 are respectively connected a second resistor R2 and a third resistor R3 which serve to prevent parasitic oscillations.

Now, the operation of the circuit of this embodiment is explained. When a signal whose potential is higher than a reference potential $V_{REF}$ is inputted to the input terminal IN, a high level output signal $V_{OH}$ as represented by the equations (1) and (2) is outputted to the output terminal OUT as in the conventional circuit shown by FIG. 1. Conversely, if a signal whose potential is lower than the reference potential $V_{REF}$ is inputted to the input terminal IN, a low level output signal $V_{OL}$ as represented by the equation (3) is outputted to the output terminal OUT as in the conventional circuit shown by FIG. 1.

Now, assuming that the current which flows through the first resistor R1 is $I_{CS2}$, such current may be given by the following equation (5):

$$I_{CS2} = -\{VT - V_f(Q2)\}/(R1 - R2/hfe) \qquad (5)$$
$$\approx -\{VT - V_f(Q2)\}/R1$$

Here, when the resistance values of the resistors concerned are set as R2=R3, since the transistors Q2 and Q3 are in a current mirror configuration, the emitter follower circuit current $I_{EF}$ which flows in the transistors Q2, Q3 will be $I_{EF}=I_{CS2}$.

Thus, the power consumed in the ECL circuit of this embodiment will be as given by the following equation (6):

$$P = -(I_{CS1} \cdot VEE - 2 \cdot I_{CS2} \cdot VT) \qquad (6)$$

Generally, the voltage of the first negative source VEE is −4.5 to −5.2 V and the voltage of the second negative source VT is −2 V. Thus, by the comparison between the equations (4) and (6), it can be appreciated that, if the circuit constants are so set that the emitter follower currents are to be the same with each other, the saving of power consumption can be achieved in the present embodiment.

Figure 3:
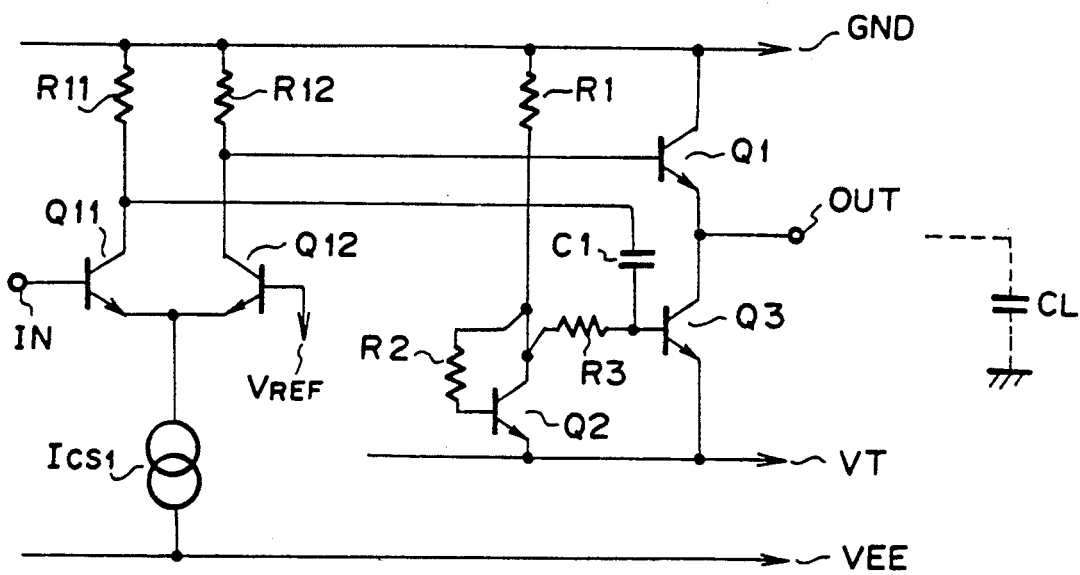
FIG. 3 is a circuit diagram of an ECL circuit of a second embodiment according to the invention.

FIG. 3 is a circuit diagram showing a second embodiment according to the present invention. A difference in this embodiment as compared with the first embodiment shown in FIG. 2 resides in that a capacitor C1 is connected between an output point of the opposite phase side of the emitter coupled differential circuit and the base of the pull-down transistor Q3.

According to this second embodiment, in transition of the output signal from high to low, the transistor Q1 temporarily turns to its OFF-state and the charge accumulated in the load capacitance CL is discharged through the pull-down transistor Q3. Under this state, the signal at the opposite phase side of the differential circuit changes from low to high and accordingly the capacitor C1 is charged. Here, since the resistor R3 is connected to the base of the transistor Q3, most of the charging current becomes the base current of the pull-down transistor Q3. Consequently, the pull-down transistor Q3 can transitorily discharge the charge in the load capacitance CL with a large current.

Figure 4:
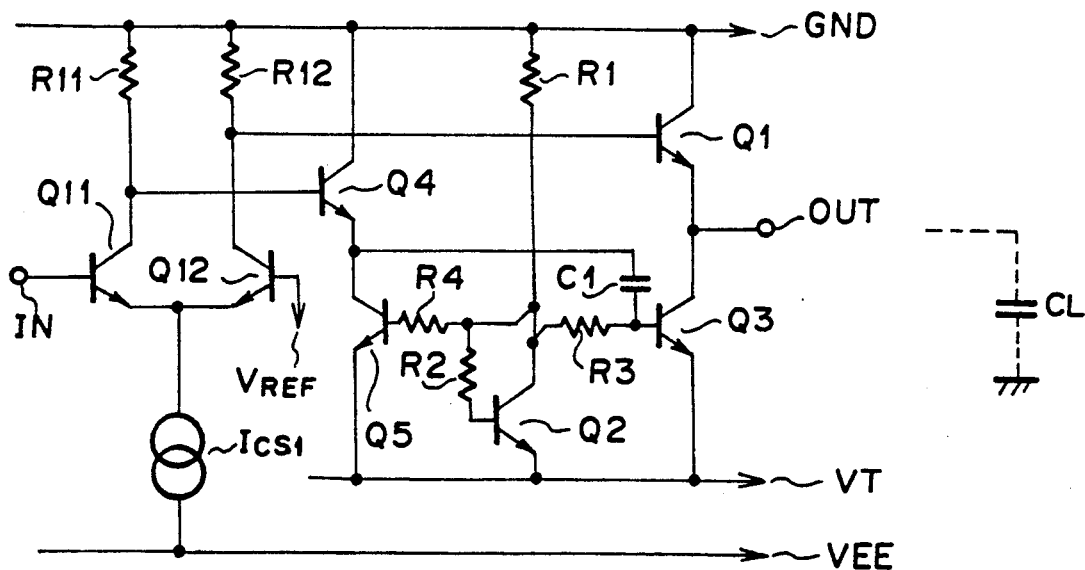
FIG. 4 is a circuit diagram of an ECL circuit of a third embodiment according to the invention.

FIG. 4 is a circuit diagram showing a third embodiment according to the present invention. A difference in this embodiment as compared with the second embodiment shown in FIG. 3 resides in that the base of a fourth transistor Q4 constituting an emitter follower configuration is connected to an output point of the opposite phase side of the emitter coupled differential circuit and the capacitor C1 is connected between the emitter of the transistor Q4 and the base of the pull-down transistor Q3. Here, the emitter follower circuit is formed by the transistors Q4, Q5 disposed between the ground potential source GND and the second negative potential source VT. The base of the transistor Q5 constituting the constant current source is coupled to the collector of the transistor Q2 through a resistor R4.

In the circuit of the second embodiment shown in FIG. 3, the charging of the capacitor C1 is determined by the time constant of the capacitor C1 and the load resistor R11. However, according to this third embodiment, since the capacitor C1 is rapidly charged by the emitter follower transistor Q4, it is possible to reduce the delay time which takes place when the output signal changes from high to low.

According to the second and third embodiments shown in FIGS. 3 and 4, respectively, the effect of the reduction in the delay time is especially remarkable when the load capacitance is large. However, when the load capacitance is small, the circuit of the first embodiment shown in FIG. 2 operates sufficiently for the purpose. In such a case, when the yielding deterioration to develop as the number of components is increased is taken into account, the circuit as shown in FIG. 2 may be more suitable or may serve the purpose better. The circuit of each of the second and third embodiments shown in FIGS. 3 and 4 is closely akin to that of the first embodiment shown in FIG. 2. Specifically, all that is different is that the capacitor C1 only or the emitter follower transistor Q4 and the capacitor C1 are added in the circuit of FIG. 2. These added components may be very effectively used especially if the use thereof is changed depending on whether the load capacitance is large or small. In a gate-array type master-slice integrated circuit device wherein a variety of desired logic circuits may be formed by having changes made only in the wiring process, it is only necessary for the circuit device to equip in each unit cell the capacitor C1, the transistors Q4, Q5 and the resistor R4. An element such as a capacitor may be selected in accordance with the magnitude of the load capacitance due to wirings extending to the output terminal of an internal ECL circuit and such element may be added in the course of the wiring process.

Figure 5:
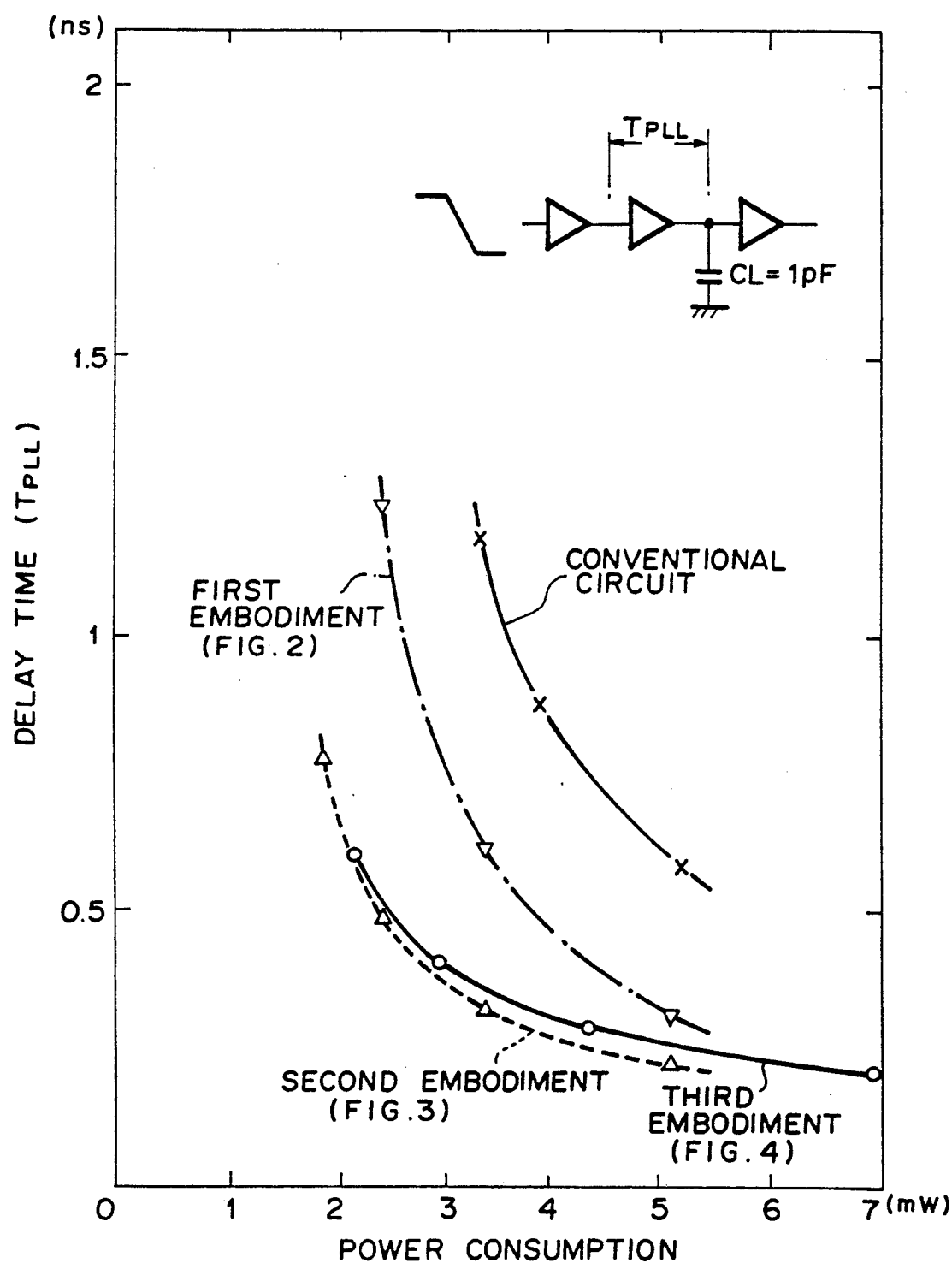
FIG. 5 is a graph showing simulation results representing characteristics obtained from the respective embodiments as compared with those in the prior art circuit.

FIG. 5 shows the results of SPICE simulation of the relations between the delay time at the falling of the output signal and the power consumption in comparison with those in a conventional example. In FIG. 5, a one-dot chain line, a dotted line and a fine line respectively show characteristics obtained from the first, second and third embodiments according to the present invention. A heavy line shows characteristics obtained from the conventional example explained above.

The respective parameter circuit-constants of the SPICE simulation are as follows:

$R11 = R12 = 2.15\ k\Omega$;

$I_{CS1} = 0.296\ mA$;

$R2 = R3 = R4 = 1\ k\Omega$;

$C1 = 0.1\ pF$;

$VEE = -4.5\ V$;

$VT = -2\ V$; and $V_{R11} = -1.0984\ V$.

As explained above, according to the present invention, there is formed an active pull-down type emitter follower circuit between the ground potential source GND and the second negative potential source VT ($-2$ V) which is higher than the first negative potential source VEE ($-4.5$ V or $-5.2$ V) used in a conventional emitter follower circuit and this enables to reduce power consumption. Also, since the resistor R3 is connected between the base of the pull-down transistor Q3 and the constant current generating circuit which is formed by the resistors R1, R2 and the transistor Q2, it is possible to prevent undesirable oscillations. Further, where the capacitor C1 is connected, the resistor R3 can effectively cause the charging current of the capacitor to flow to the pull-down transistor, resulting in shortening the delay time at the falling of the output signal. Also, in a master-slice integrated circuit device, since such elements as a capacitor and an emitter follower to drive such capacitor are those which are selectively connected, there is no need to increase the number of extra parts or elements for logic circuits which are subjected to only light load capacitance and, thus, it is possible to improve operation speeds only in those logic circuits that are subjected to heavy load capacitance.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. An emitter coupled logic circuit comprising:
   a differential amplifier circuit provided between a higher potential source and a first lower potential source and having a first and a second output node;
   a first transistor forming an emitter follower configuration and having its base connected to said first output node of said differential amplifier circuit, its collector connected to said higher potential source and its emitter connected to an output terminal;

a second transistor having its collector connected to said higher potential source through a current source, its emitter connected to a second lower potential source whose potential is higher than that of said first lower potential source, and its base coupled to said collector thereof through a resistor;

a third transistor having its collector connected to said output terminal, its emitter connected to said second lower potential source, and its base coupled to a collector of said second transistor through a resistor; and a capacitor having its one end connected to said second output node of said different amplifier circuit and having its other end connected to a base of said third transistor.

2. An emitter coupled logic circuit according to claim 1, which is of a master-slice type and in which said capacitor is selectively connected during the wiring process in accordance with the magnitude of load capacitance connected to said output terminal.

3. An emitter coupled logic circuit comprising:
a differential amplifier circuit provided between a higher potential source and a first lower potential source and having a first and a second output node;
a first transistor forming an emitter follower configuration and having its base connected to said first output node of said differential amplifier circuit, its collector connected to said higher potential source, and its emitter connected to an output terminal;
a second transistor having its collector connected to said higher potential source through a current source, its emitter connected to a second lower potential source whose potential is higher than that of said first lower potential source, and its base coupled to said collector thereof through a resistor;

a third transistor having its collector connected to said output terminal, its emitter connected to said second lower potential source, and its base coupled to a collector of said second transistor through a resistor;

a fourth transistor forming an emitter follower configuration and having its base connected to said second output node of said differential amplifier circuit, its collector connected to said higher potential source, and its emitter connected to said second lower potential source through a constant current source; and a capacitor having its one end connected to an emitter of said fourth transistor and its other end connected to a base of said third transistor.

4. An emitter coupled logic circuit according to claim 3, in which said constant current source is formed by a fifth transistor having its collector connected to the emitter of said fourth transistor, its base coupled to the collector of said second transistor through a resistor, and its emitter connected to said second lower potential source.

5. An emitter coupled logic circuit according to according to claim 3, which is of a master-slice type and in which said fourth transistor and said capacitor are selectively connected during the wiring process in accordance with the magnitude of load capacitance connected to said output terminal.

* * * * *